United States Patent [19]
Gross et al.

[11] Patent Number: 4,617,654
[45] Date of Patent: Oct. 14, 1986

[54] MATRIX CIRCUIT FOR OPTICAL DISC SYSTEMS

[75] Inventors: William H. Gross, Sunnyvale, Calif.;
Toyojiro Naokawa, Tsurugashimamachi, Japan

[73] Assignee: National Semiconductor Corporation, Santa Clara, Calif.

[21] Appl. No.: 619,965

[22] Filed: Jun. 12, 1984

[51] Int. Cl.$^4$ .............................................. G11B 7/13
[52] U.S. Cl. ...................................... 369/46; 369/124; 369/45
[58] Field of Search ................... 369/44, 45, 46, 124, 369/120; 307/311, 467; 250/201

[56] References Cited
U.S. PATENT DOCUMENTS

| 4,011,400 | 3/1977 | Simons et al. | 369/46 |
| 4,337,534 | 6/1982 | Basilico et al. | 369/46 |
| 4,355,383 | 10/1982 | Dolby | 369/124 |

Primary Examiner—Donald McElheny, Jr.
Attorney, Agent, or Firm—Gail W. Woodward; Paul J. Winters

[57] ABSTRACT

A matrix circuit is disclosed having four inputs for coupling to either the four elements in a four-quadrant photodetector in a one-beam optical disc system or to the six elements in a hex photodetector in a three-beam optical disc system. A fifth input is provided with a logic input determined by which system is being implemented. Three outputs are provided, one each for signal, tracking error and focus error. The circuit will accommodate both systems to produce the required outputs with a minimum of redundant parts.

5 Claims, 3 Drawing Figures

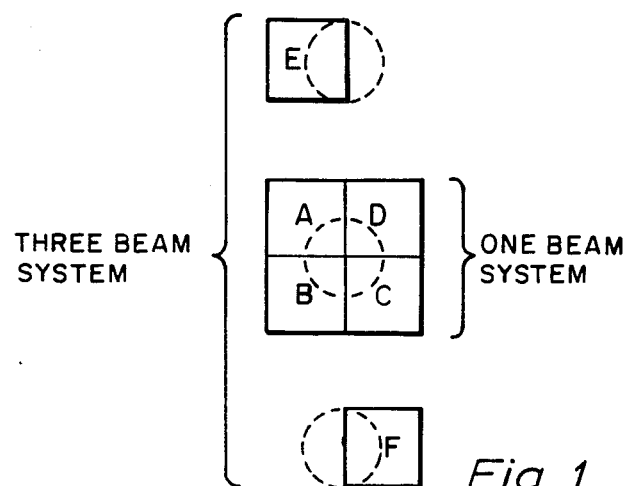
Fig_1
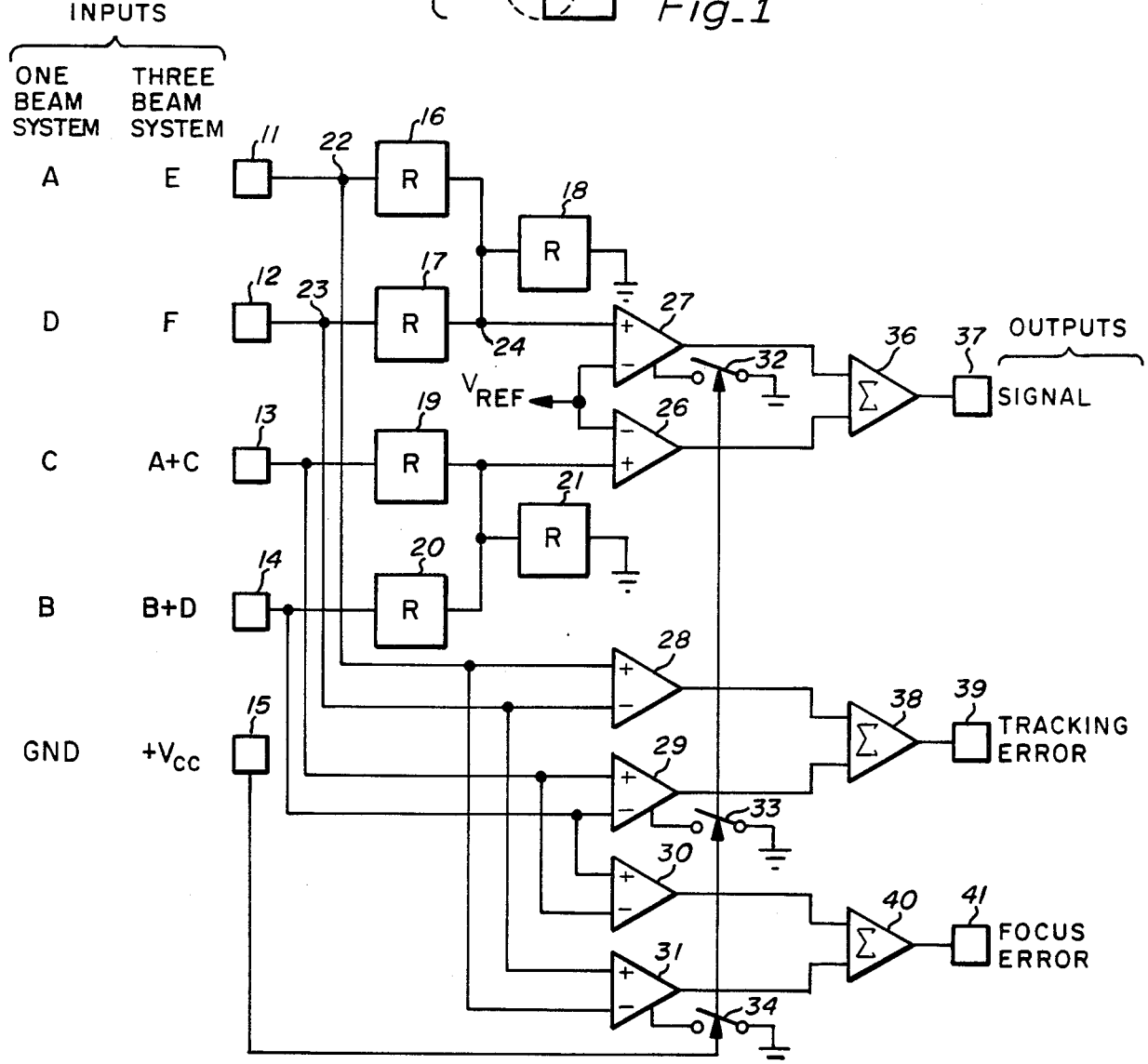
Fig_2

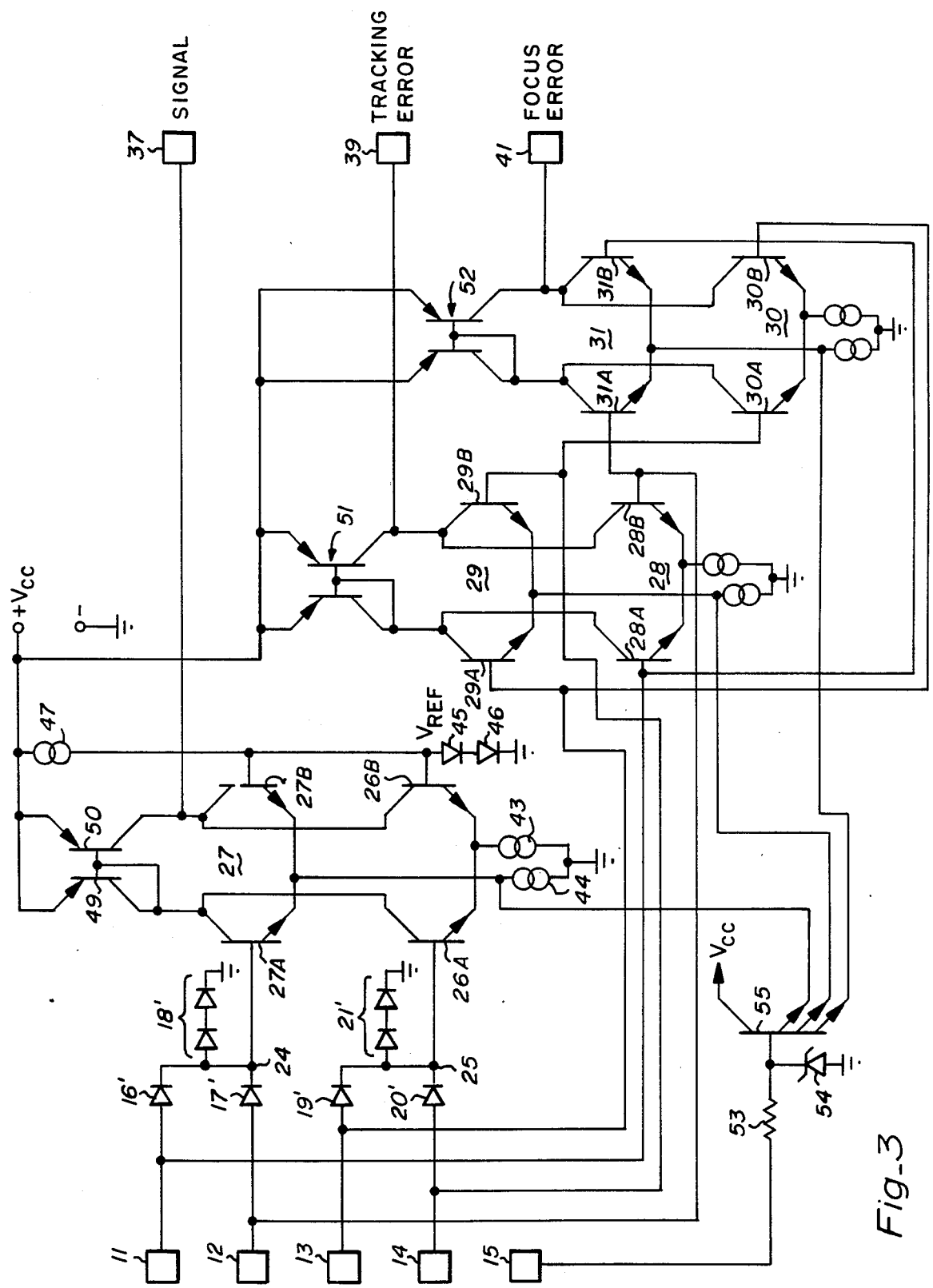
Fig._3

MATRIX CIRCUIT FOR OPTICAL DISC SYSTEMS

BACKGROUND OF THE INVENTION

The invention relates to the so-called optical disc record system. In this system a spiral groove or track on a record disc is scanned by an optical pick up which can reproduce the track modulation. Such a system is disclosed in U.S. Pat. No. 4,065,786 which shows how a tracking error and recorded signal information can be obtained from a four quadrant photo detector. An optical system directs a coherent blue light source into a beam that impinges upon the record track. The photodetector is illuminated by the light reflected from the track. The circuits that combine the photodetector outputs to produce the signal and tracking error components are referred to as matrix circuit elements. The tracking error signal is employed to operate a servo system that deflects the light beam to its desired location. When the beam is on track the signal output is a reproduction of the track modulation.

The system disclosed in U.S. Pat. No. 4,065,786 employs a single optical beam which takes the place of the well known phonograph pick up stylus. This results in a pick up having reduced mechanical resonances and eliminates the friction that ordinarily produces wear in the pick up and the disc. Since the coherent light can be focused to a very small spot, the track can be recorded in a relatively small space. Other optical disc pick up systems employ plural optical beams, the most common being a three-beam system. In the three-beam system a six-element photodetector is employed to develop the recorded signal and tracking error information. In either a three-beam or a one-beam system it is desirable to develop, within the matrix, a third error signal that is related to beam focusing. This signal will be employed to drive a servo system that positions the focusing lens with respect to the disc surface. It would be desirable to have an integrated circuit (IC) that can be employed in either of the above-described systems with a minimum of redundancy and complexity.

SUMMARY OF THE INVENTION

It is an object of the invention to provide an IC that combines the inputs from either a four quadrant detector in a single beam optical disc system, or a hex detector in a three beam optical disc system, to produce a signal output, a tracking output and a focus output.

It is a further object of the invention to provide a digital input to an IC to determine whether it is to function in a one beam optical disc system or a three beam optical disc system, with the circuit providing the desired outputs produced in response to photodetector arrays with a minimum of redundant parts and complexity.

These and other objects are achieved in an IC that has five input terminals, four of which are connected to the elements in a photodecetor array. The fifth terminal is available as an input that is determined by which disc system is being employed. The fifth terminal is high or at $+V_{CC}$ for the three-beam system and returned to ground or low for the one-beam system. The four photodetector input terminals are returned to ground by way of resistance elements which convert the photocurrents to photovoltages. The thus developed voltages are applied to a plurality of operational amplifiers and summers which operate to produce three outputs. The first output is the so-called signal component which is related to the sum of the four quadrant photodetector currents. The second output is related to the difference between the sums of adjacent element photocurrents and is called the tracking error output. In the three-beam system the tracking error is obtained by taking the difference between the photocurrents in an additional pair of elements in the photodetector. The third output is referred to as the focus error which is obtained by taking the difference between the sums of diagonal photodetector currents in the single beam system. Thus, the circuit of the invention described herein involves an IC having ten pins. The circuit can be employed as shown, or it can be further integrated with still other circuit functions in a higher level of integration.

BRIEF DESCRIPTION OF THE DRAWING

FIG. 1 shows the layout of a plural element photodetector array suitable for use in optical disc systems.

FIG. 2 is a block diagram of the circuit of the invention.

FIG. 3 is a schematic diagram of a circuit that implements, in IC form, the function of FIG. 2.

DESCRIPTION OF THE INVENTION

FIG. 1 shows the construction of the plural photodetector devices used in video disc systems. Elements A, B, C and D form the single-beam pick up array in a structure known as a four-quadrant detector array. The dashed outline shows the relative size of a focused single beam. In operation the array is placed near the focus of a collecting lens (not shown) that illuminates the four elements with the light reflected from the optical disc. In a three-beam system two additional elements E and F are incorporated into the structure to form the array shown. These elements are located where the additional two beams are located.

FIG. 2 shows how the detector elements are connected to produce the desired outputs. Input pads 11–15 are connected as shown to provide input currents from the photodetector array. In a one-beam system a four quadrant detector has its elements A, D, C and B connected respectively to pads 11–14 of the IC. Pad 15 is returned to ground for a logic zero in the one-beam system. In a three-beam system, pads 11–14 are connected respectively to detector elements E, F, A and C, and B and D. In the three-beam system pad 15 is at $+V_{CC}$ for a logic one.

Resistor elements 16–21 act to return the input photocurrents to ground so as to produce photovoltages. By way of example, the photovoltages at nodes 22 and 23 will be related to the photocurrent at pads 11 and 12. The photovoltage at node 24 will be related to the sum of the photocurrents at pads 11 and 12.

The various photovoltages are applied to operational amplifiers (op amps) 26–31. Op amps 27, 29 and 31 respectively incorporate switches 32–34 which are operated from pad 15. When pad 15 is low (at ground) the switches will be on and the corresponding op amps functional. When pad 15 is high op amps 27, 29 and 31 will be turned off.

Op amps 26 and 27 have their outputs combined in summer 36 which drives signal output pad 37. Op amps 28 and 29 have their outputs combined in summer 38 which drives tracking error output pad 39. Op amps 30 and 31 have their outputs combined in summer 40 which drives focus error output pad 41. The following chart shows the nature of the outputs of the various pads as a function of the systems and in terms of the photodetector structure of FIG. 1.

|  | One-Beam System | Three-Beam System |
| --- | --- | --- |
| Signal Output Pad 37 | A + D + C + B | A + C + B + D |
| Tracking Error Pad 39 | (A + B) − (C + D) | E − F |
| Focus Error Pad 41 | (B + D) − (A + C) | (B + D) − (A + C) |

It can be seen that the signal output at pad 37 will be the sum of the four photodetector quad array for both systems. The tracking error signal at pad 39 for the one-beam system represents the difference between the sums of the left and right hand photodetector elements. For the three-beam system the tracking error is simply the difference between the photocurrents in the two additional detector elements. In either system when the beam is on track the tracking error will be zero.

The focus error signal on pad 41 represents the difference between the sums of the diagonal elements in the four quadrant array. When the focusing lens is properly positioned with respect to the optical disc this signal will be zero and its polarity will be a function of which way the lens deviates from focus. This is due to the fact that at focus the beam spot will be round. But, as the focus deviates, the spot goes elliptical with its orientation depending upon the direction of the deviation.

FIG. 3 is a schematic diagram of a circuit useful in performing the functions of the blocks in FIG. 2 and is intended for conventional silicon PN junction isolated monolithic integrated circuit construction. Where possible, the element numbers of FIG. 2 are employed.

Resistor elements 16–21 are realized using forward biased diodes 16′–21′. The diodes are forward biased by the photocurrents in the photodetector array. This produces photovoltages at input terminals 11–14 that are logarithmically related to the sum of the photocurrents at terminals 11 and 12. Using diodes in this manner provides an easily obtained resistance of the desired value which varies with current so as to provide signal voltage compression. This means that the resistance values do not have to be precisely controlled. Furthermore, the diodes can be matched in area so that there is no resistor matching problem. The diode array also provides bias matching at the differential op-amp inputs.

Transistors 26A and 26B form op amp 26 while constant current device 43 provides the tail current. Likewise, transistors 27A ad 27B form op amp 27 and constant current device 44 sets its tail current. $V_{REF}$, which is applied to the inverting inputs of op amps 26 and 27, is developed across diodes 45 and 46 by current source 47. It can be seen that the bases of transistors 26B and 27B are also at two diodes above ground. This matches the bias on transistors 26A and 27A as established by diodes 21′ and 18′ respectively. Current source 47 is operated to produce a current that nominally equals the typical photocurrents in the detector array elements.

Transistors 49 and 50 form a current mirror load that provides op amps 26 and 27 with a single ended output. They also act to sum the currents in op amps 26 and 27. Thus, the output at pad 37 is a current proportional to the sum of the voltages at nodes 24 and 25. As shown above, these voltages are proportional to the sum of the photocurrents applied to terminals 11–14 for the one-beam system. In the three-beam system the output is proportional to the sum of the photocurrents applied to pads 13 and 14.

The other op amps 28–31 are constructed in the same manner and have their inputs connected to terminals 11–14 as shown. Loads 51 and 52 respectively operate with op amps 28–29 and 30–31 to provide single ended summed outputs at pads 39 and 41.

Resistor 53 couples terminal 15 to zener diode 54 which in turn is connected to the base of plural emitter transistor 55. Transistor 55 is shown having its collector returned to $+V_{CC}$ and three emitters connected respectively to op amps 27, 29 and 31. When terminal 15 is low no current will flow in resistor 53 and transistor 55 will be non-conductive. For this condition op amps 27–31 are turned on and will operate normally. When terminal 15 is pulled up to a logic one, current will flow in resistor 53 to bias zener diode 54 into reverse breakdown which is typically about 6–7 volts. This will in turn pull the emitters of transistor 55 up. The voltage rise will act to turn op amps 27, 29 and 31 off. The zener diode action will limit the voltage rise so that the off op amps emitters will not be driven into zenering.

The invention has been described with reference to a preferred circuit. When a person skilled in the art reads the foregoing description, alternatives and equivalents, within the spirit and intent of the invention, will be apparent. Accordingly, it is intended that the scope of the invention be limited only be the following claims.

We claim:

1. An integrated circuit for combining the photocurrents produced by a four quadrant photodetector array in a single beam optical disc system or by a six photodetector array in a three-beam optical disc system to produce signal, tracking error, and focus error outputs, said circuit comprising:
   first, second, third and fourth input terminals for receiving photocurrents from a photodetector array;
   a fifth input terminal for receiving a logic signal determined by which of the two systems is employed;
   conductive means connected to each of said first, second, third and fourth terminals for conducting said photocurrents to a common circuit point, said conductive means being connected in a branching configuration whereby said photocurrents in said input terminals can be combined in pairs;
   three pairs of op amps having differential input terminals coupled to respond to said photocurrents in said first, second, third and fourth input terminals with the output terminals of each pair being coupled together in a summer to produce one of said outputs; and
   means responsive to the logic signal on said fifth input terminal for turning one op amp in each of said three pairs on and off.

2. The circuit of claim 1 wherein said conductive means comprise diodes poled to conduct said photocurrents in the forward direction.

3. The circuit of claim 2 wherein said conductive means comprise:
   a first diode pair having anodes connected to said first and second input terminals and common cathodes connected to a second diode pair coupled in series between said common cathodes and said circuit common point whereby said common cathodes of said first diode pair represent the sum of the photocurrents at said first and second input terminals;

a third diode pair having anodes connected to said third and fourth input terminals and common cathodes connected to a fourth diode pair coupled in series between said common cathodes of said third diode pair and said circuit common point whereby said common cathodes of said third diode pair represent the sum of the photocurrents in said second and third input terminals; and said three pairs of op amps further comprise:

means for coupling said common cathodes of said first and second diode pairs to the noninverting inputs of the first pair of said three pairs of op amps;

means for coupling the inverting inputs of said first pair of op amps to a source of reference potential operating at two diodes above said common circuit point; and means for summing the output currents in said first pair of op amps to provide said signal output.

4. The circuit of claim 3 wherein said three pairs of op amps further comprise means for coupling the inputs of the second pair of said three pairs of op amps to said first, second, third and fourth input terminals; and means for summing the output currents in said second pair of op amps to provide said tracking error output.

5. The circuit of claim 3 wherein said three pairs of op amps further comprise means for coupling the inputs of the third pair of said three pairs of op amps to said first, second, third and fourth input terminals; and means for summing the output currents in said third pair of op amps to provide said focus error output.

* * * * *